(12) United States Patent
Uchida

(10) Patent No.: US 10,224,436 B2
(45) Date of Patent: Mar. 5, 2019

(54) SEMICONDUCTOR DEVICE

(71) Applicant: Panasonic Intellectual Property Management Co., Ltd., Osaka (JP)

(72) Inventor: Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/944,399

(22) Filed: Apr. 3, 2018

(65) Prior Publication Data

US 2018/0308992 A1    Oct. 25, 2018

(30) Foreign Application Priority Data

Apr. 25, 2017    (JP) .................... 2017-086315

(51) Int. Cl.
   *H01L 29/872*    (2006.01)
   *H01L 29/16*    (2006.01)
   (Continued)

(52) U.S. Cl.
   CPC ........ *H01L 29/872* (2013.01); *H01L 21/0465* (2013.01); *H01L 29/0623* (2013.01);
   (Continued)

(58) Field of Classification Search
   None
   See application file for complete search history.

(56) References Cited

U.S. PATENT DOCUMENTS

2008/0296587 A1    12/2008    Yamamoto et al.
2015/0214353 A1*   7/2015    Yamada ............ H01L 29/66068
                                                                257/77
(Continued)

FOREIGN PATENT DOCUMENTS

JP    2008-300506    12/2008

OTHER PUBLICATIONS

Sheridan, D.C. "Comparison and optimization of edge termination techniques for SiC power devices" Proc. of the 13th Int. Symp. Pow. Sem. Dev. & ICs ISPD Jul. 8, 2002 pp. 191-194.*

(Continued)

*Primary Examiner* — Asok K Sarkar
*Assistant Examiner* — Grant Withers
(74) *Attorney, Agent, or Firm* — McDermott Will & Emery LLP

(57)    ABSTRACT

A semiconductor device includes a semiconductor substrate, a silicon carbide semiconductor layer disposed on the semiconductor substrate, and a termination region disposed in the silicon carbide semiconductor layer. The termination region has a guard ring region and an FLR region which is disposed to surround the guard ring region while being separated from the guard ring region, the FLR region including a plurality of rings. The termination region includes a sector section, and in the sector section, an inner circumference and an outer circumference of at least one of the plurality of rings and an inner circumference and an outer circumference of the guard ring region have a same first center of curvature, the first center of curvature being positioned inside the inner circumference of the guard ring region, and a radius of curvature of the inner circumference of the guard ring region is 50 μm or less.

9 Claims, 13 Drawing Sheets

(51) Int. Cl.
*H01L 21/04* (2006.01)
*H01L 29/66* (2006.01)
*H01L 29/06* (2006.01)

(52) U.S. Cl.
CPC ...... *H01L 29/1608* (2013.01); *H01L 29/6606* (2013.01); *H01L 29/66068* (2013.01)

(56) References Cited

U.S. PATENT DOCUMENTS

2016/0141371 A1* 5/2016 Tega .................. H01L 21/0465
257/77
2016/0315203 A1* 10/2016 Uchida ................. H01L 29/872
2016/0372540 A1* 12/2016 Kitamura ............ H01L 29/0615

OTHER PUBLICATIONS

Mahajan, A. "Design and optimization of junction termination extension (JTE) for 4H-SiC high voltage Schottky diode" Solid-State Elec. vol. 49, Iss. 6, Jun. 2005 pp. 945-955.*
Kao, Y. C. "High-Voltage Planar p-n Junctions" Proc. of the IEEE, vol. 55, No. 8 Aug. 1967 pp. 1409-1414.*

* cited by examiner

SEMICONDUCTOR DEVICE

BACKGROUND

1. Technical Field

The present disclosure relates to a semiconductor device.

2. Description of the Related Art

Silicon carbide (SiC) is a semiconductor material having a greater bandgap and a greater degree of hardness, compared with silicon (Si). SiC is applied to semiconductor devices such as switching devices and rectifying devices. A semiconductor device made of SiC can advantageously reduce a power loss, for example, compared with a semiconductor device made of Si.

Typical semiconductor devices made of SiC include metal-insulator-semiconductor field-effect transistors (MISFETs) and Schottky-barrier diodes (SBDs). A metal-oxide-semiconductor field-effect transistor (MOSFET) is one kind of MISFETs. A junction-barrier Schottky diode (JBS) is one kind of SBDs.

A semiconductor device made of SiC (hereinafter referred to as "SiC semiconductor device") includes a semiconductor substrate and a semiconductor layer. The semiconductor layer is made of SiC, and is disposed on a main surface of the semiconductor substrate. Above the semiconductor layer, an electrode is disposed as a front face electrode for electrical external connecting. At (or around) a terminal of the SiC semiconductor device, a termination structure is provided on the semiconductor layer that alleviates an electric field (see PTL 1).

CITATION LIST

Patent Literature

PTL 1: Unexamined Japanese Patent Publication No. 2008-300506

SUMMARY

A highly reliable semiconductor device has been demanded for use in a high-voltage and large electric current environment.

However, in the conventional SiC semiconductor device disclosed in PTL 1, corners of an effective region through which a large electric current can flow have small curvature in a plan view for use in a high-voltage environment. Therefore, the area of the effective region is reduced, which may raise a possibility of failing to ensure a sufficient amount of electric current.

One aspect of the present disclosure provides a semiconductor device for use in a high-voltage and large electric current environment.

In order to address the foregoing problem, one aspect of the present disclosure includes a semiconductor device described below. Specifically, this semiconductor device includes a semiconductor substrate of a first conductivity type, a silicon carbide semiconductor layer of a first conductivity type, a termination region of a second conductivity type, a first electrode, and a second electrode. The semiconductor substrate of the first conductivity type has a main surface and a back surface. The silicon carbide semiconductor layer of the first conductivity type is disposed on the main surface of the semiconductor substrate. The termination region of the second conductivity type is disposed in the silicon carbide semiconductor layer. The first electrode is disposed on the silicon carbide semiconductor layer and forms a Schottky contact with the silicon carbide semiconductor layer. The second electrode is disposed on the back surface of the semiconductor substrate and forms an ohmic contact with the semiconductor substrate. The termination region is disposed to surround a part of a surface of the silicon carbide semiconductor layer as viewed in a normal direction of the main surface of the semiconductor substrate. The termination region also has a guard ring region of a second conductivity type abutting the surface of the silicon carbide semiconductor layer, and a field limiting ring (FLR) region which is disposed to surround the guard ring region while being separated from the guard ring region, the FLR region including a plurality of rings of a second conductivity type. The first electrode has a face abutting the silicon carbide semiconductor layer. The first electrode also abuts the guard ring region at an edge of the face abutting the silicon carbide semiconductor layer. The termination region has a sector section as viewed in the normal direction of the surface of the silicon carbide semiconductor layer. In this sector section, an inner circumference and an outer circumference of at least one of the plurality of rings and an inner circumference and an outer circumference of the guard ring region have a same first center of curvature. The first center of curvature is positioned inside the inner circumference of the guard ring region, and a radius of curvature of the inner circumference of the guard ring region is 50 µm or less.

The aspects of the present disclosure described above may be implemented, either comprehensively or specifically, by a system, a procedure, an integrated circuit, a computer program, or a storage medium. Alternatively, they may be implemented by any desired combinations of a system, an apparatus, a procedure, an integrated circuit, a computer program, and a storage medium.

According to one aspect of the present disclosure, a semiconductor device for use in a high-voltage and large electric current environment can be provided.

DETAILED DESCRIPTION

Figure 1A:
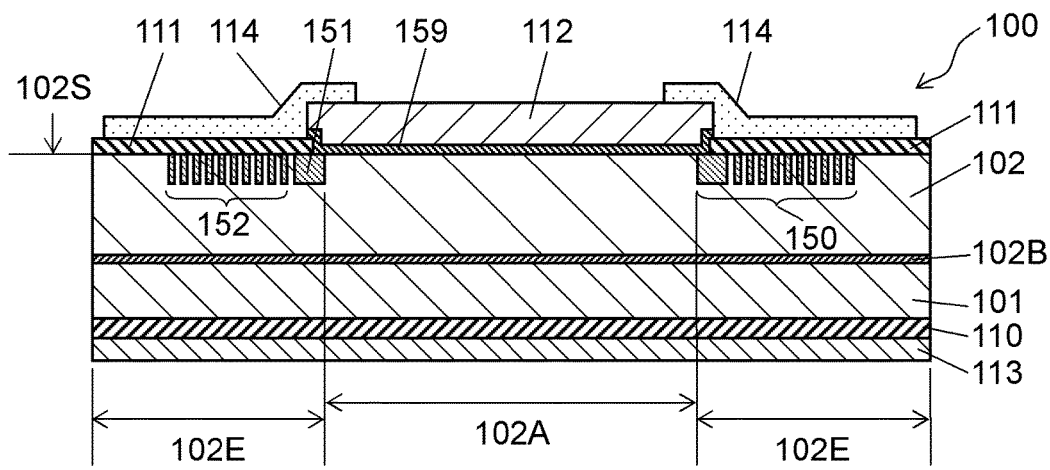
FIG. 1A is a view illustrating a cross section of a semiconductor device according to an exemplary embodiment of the present disclosure.

Outline of one aspect of the present disclosure is as follows.

A semiconductor device according to one aspect of the present disclosure includes a semiconductor substrate of a first conductivity type, a silicon carbide semiconductor layer of a first conductivity type, a termination region of a second conductivity type, a first electrode, and a second electrode. The semiconductor substrate of the first conductivity type has a main surface and a back surface. The silicon carbide semiconductor layer of the first conductivity type is disposed on the main surface of the semiconductor substrate. The termination region of the second conductivity type is disposed in the silicon carbide semiconductor layer. The first electrode is disposed on the silicon carbide semiconductor layer and forms a Schottky contact with the silicon carbide semiconductor layer. The second electrode is disposed on the back surface of the semiconductor substrate and forms an ohmic contact with the semiconductor substrate. The termination region is disposed to surround a part of a surface of the silicon carbide semiconductor layer as viewed in a normal direction of the main surface of the semiconductor substrate. The termination region also has a guard ring region of a second conductivity type abutting the surface of the silicon carbide semiconductor layer, and a field limiting ring (FLR) region which is disposed to surround the guard ring region while being separated from the guard ring region, the FLR region including a plurality of rings of a second conductivity type. The first electrode has a face abutting the silicon carbide semiconductor layer. The first electrode also abuts the guard ring region at an edge of the face abutting the silicon carbide semiconductor layer. The termination region has a sector section as viewed in the normal direction of the surface of the silicon carbide semiconductor layer. In this sector section, an inner circumference and an outer circumference of at least one of the plurality of rings and an inner circumference and an outer circumference of the guard ring region have a same first center of curvature. The first center of curvature is positioned inside the inner circumference of the guard ring region, and a radius of curvature of the inner circumference of the guard ring region is 50 μm or less.

The radius of curvature of the inner circumference of the guard ring region may be 10 μm or more, for example.

The radius of curvature of the inner circumference of the guard ring region may be 10 μm or less, for example.

The inner circumference of the guard ring region may have a right-angled corner, for example.

The termination region may further include at least two straight parts whose inner periphery and outer periphery are formed by a straight line, for example, and the sector section may be disposed to connect ends of the at least two straight parts, for example.

A semiconductor device according to one aspect of the present disclosure includes a semiconductor substrate of a first conductivity type, a silicon carbide semiconductor layer of a first conductivity type, a termination region of a second conductivity type, a first electrode, and a second electrode. The semiconductor substrate of the first conductivity type has a main surface and a back surface. The silicon carbide semiconductor layer of the first conductivity type is disposed on the main surface of the semiconductor substrate. The termination region of the second conductivity type is disposed in the silicon carbide semiconductor layer. The first electrode is disposed on the silicon carbide semiconductor layer and forms a Schottky contact with the silicon carbide semiconductor layer. The second electrode is disposed on the back surface of the semiconductor substrate and forms an ohmic contact with the semiconductor substrate. The termination region is disposed to surround a part of a surface of the silicon carbide semiconductor layer as viewed in a normal direction of the main surface of the semiconductor substrate. The termination region has a guard ring region of a second conductivity type abutting the surface of the silicon carbide semiconductor layer, and a field limiting ring (FLR) region which is disposed to surround the guard ring region while being separated from the guard ring region, the FLR region including a plurality of rings of a second conductivity type. The first electrode has a face abutting the silicon carbide semiconductor layer. The first electrode also abuts the guard ring region at an edge of the face abutting the silicon carbide semiconductor layer. The termination region has a sector section as viewed in the normal direction of the surface of the silicon carbide semiconductor layer. In this sector section, an inner circumference and an outer circumference of at least one of the plurality of rings and an outer circumference of the guard ring region have a same first center of curvature. The first center of curvature is positioned on the inner circumference of the guard ring region or within the guard ring region.

When a width of the guard ring region is defined as W (μm), the radius of curvature of the outer circumference of the guard ring region may be 50+W (μm) or less, for example.

The inner circumference of the guard ring region may have a second center of curvature different from the first center of curvature, for example. In this case, the second center of curvature may be positioned inside the inner circumference of the guard ring region as viewed in the normal direction of the surface of the silicon carbide semiconductor layer, for example. The radius of curvature of the inner circumference of the guard ring region may be 10 μm or less, for example.

The termination region may further have at least two straight parts whose inner periphery and outer periphery are formed by a straight line, for example. The sector section may be disposed to connect ends of the at least two straight parts, for example.

An exemplary embodiment of the present disclosure will now be described in detail. However, descriptions in more detail than necessary may be omitted. For example, the detailed description of well-known matters and repeated description of substantially the same configuration may be omitted. This is to avoid the following description from being unnecessarily redundant, and to facilitate understanding by those skilled in the art. The inventor of the present disclosure provides the appended drawings and the following description in order to allow those skilled in the art to fully understand the present disclosure, and does not intend to limit the subject matter described in the appended claims by the appended drawings and the following description. In the following description, components having identical or similar functions are denoted by the same reference numerals or symbols.

(Exemplary Embodiment)

A semiconductor device according to an exemplary embodiment of the present disclosure will now be described herein with reference to the accompanying drawings. This exemplary embodiment describes, but not limited to, an example where a first conductivity type is n-type, and a second conductivity type is p-type. In the exemplary embodiment of the present disclosure, the first conductivity type may be p-type, and the second conductivity type may be n-type.

(Structure of Semiconductor Device)

Semiconductor device 100 according to the present exemplary embodiment will be described with reference to FIGS. 1A to 13.

Figure 1B:
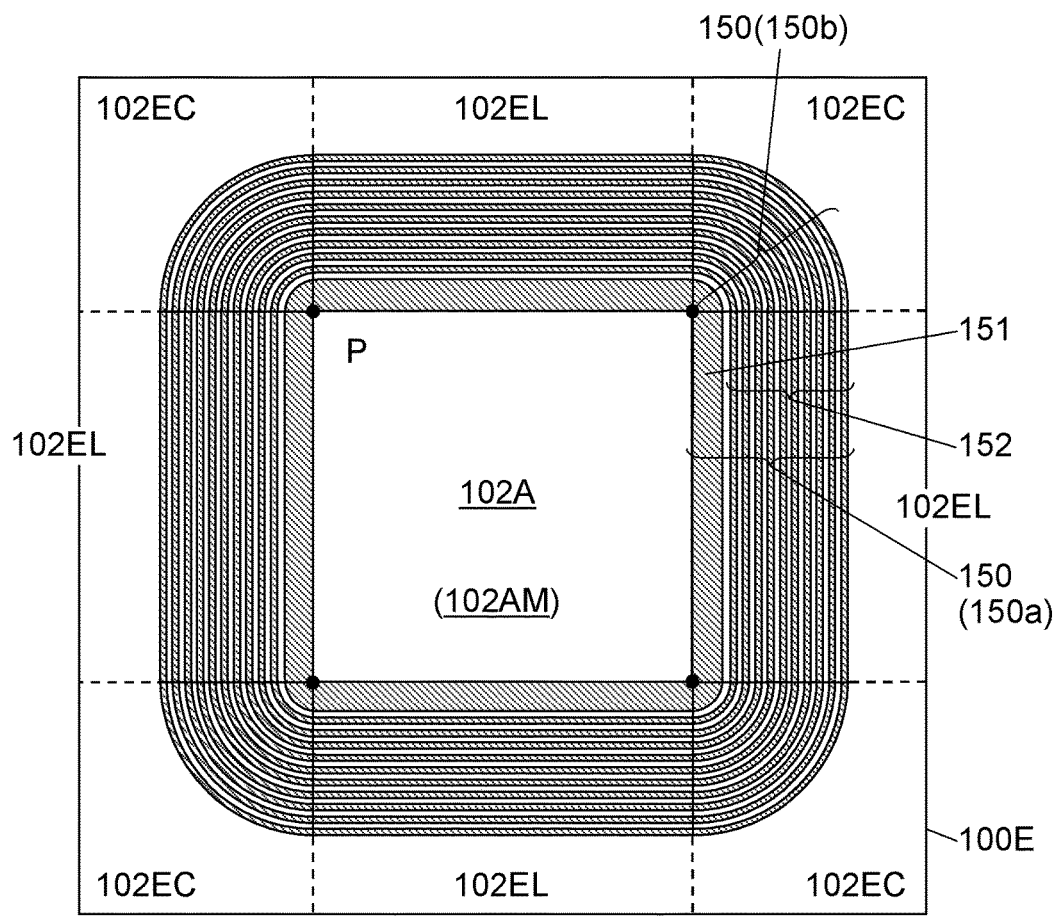
FIG. 1B is a plan view illustrating a termination region formed on a drift layer of the semiconductor device according to the exemplary embodiment of the present disclosure.

FIGS. 1A and 1B respectively are a sectional view and a plan view schematically illustrating semiconductor device 100 according to the exemplary embodiment. Semiconductor device 100 includes semiconductor substrate 101 of a first conductivity type and drift layer 102. Drift layer 102 is a silicon carbide semiconductor layer of a first conductivity type disposed on a main surface of semiconductor substrate 101. While buffer layer 102B is provided between drift layer 102 and semiconductor substrate 101 in FIG. 1A, buffer layer 102B may not be provided. Termination region 150 of a second conductivity type is disposed in drift layer 102. Termination region 150 of the second conductivity type includes guard ring region 151 and field limiting ring (FLR) region 152 which surrounds guard ring region 151 and includes a plurality of rings.

First electrode 159 is disposed on drift layer 102. First electrode 159 forms a Schottky contact with drift layer 102. First electrode 159 abuts guard ring region 151 at an edge of a face abutting drift layer 102 which is a silicon carbide semiconductor layer. A metal material abutting guard ring region 151 may be only first electrode 159. Guard ring region 151 may have a non-ohmic contact with first electrode 159. Front face electrode 112 is disposed on a surface of first electrode 159.

Insulating film 111 is disposed on a part of surface 102S of drift layer 102 so as to cover a part of termination region 150. A part of first electrode 159 may cover insulating film 111 from above. Passivation film 114 is disposed to cover a part of insulating film 111 from above. Passivation film 114 may cover a part of front face electrode 112.

Second electrode 110 is disposed on a back surface which is on the opposite side of semiconductor substrate 101 from the main surface. Second electrode 110 forms an ohmic contact with semiconductor substrate 101. Back face electrode 113 is disposed on a lower face of second electrode 110, i.e., a face opposite to a face abutting semiconductor substrate 101.

As illustrated in FIG. 1A, termination region 150 may have guard ring region 151 of a second conductivity type abutting a part of first electrode 159 and FLR region 152. FLR region 152 is a floating region of a second conductivity type disposed to surround guard ring region 151 and including a plurality of rings. FLR region 152 is disposed so as not to be in contact with guard ring region 151. Termination region 150 is not limited to have the configuration described above, as long as it has at least one region disposed to surround a part of the surface of drift layer 102. For example, termination region 150 may have a junction-termination extension (JTE) structure through which a concentration of impurities that are the second conductivity type varies in the in-plane direction of semiconductor substrate 101.

FIG. 1B is a plan view illustrating surface 102S of drift layer 102 of semiconductor device 100. For simplifying the description, components on surface 102S of drift layer 102 are not illustrated. A region inside termination region 150 is effective region 102A, and an electric current flows through effective region 102A on surface 102S of drift layer 102. A region other than effective region 102A on surface 102S of drift layer 102 is defined as surrounding region 102E. Surrounding region 102E includes guard ring region 151 and FLR region 152. Note that a chip end of semiconductor device 100 is indicated as 100E. In this example, semiconductor device 100 is cut into a square shape. However, semiconductor device 100 may be cut into a rectangular shape or other polygonal shapes. Generally, semiconductor device 100 is cut into a rectangular shape from a circular semiconductor wafer.

When a negative voltage with respect to second electrode 110 is applied to first electrode 159 of semiconductor device 100, a breakdown voltage may be reduced due to concentration of a high electric field in semiconductor device 100. To suppress the reduction in the breakdown voltage, termination region 150 is provided, and in this example, termination region 150 is formed to have a curvature at corners of semiconductor device 100 as illustrated in FIG. 1B. For example, termination region 150 can be expressed by at least two straight regions 150a whose inner periphery and outer periphery are formed by a straight line, and sector region 150b having a curved line. Sector region 150b is formed to connect the ends of at least two straight regions 150a. In this example, the inner periphery and the outer periphery of each of the straight regions 150a are formed only by a straight line, but a part of the inner perimeter and a part of the outer perimeter may not be linear. In addition, two regions which are connected to sector region 150b are not limited to be straight region 150a, and may be a region having an inner perimeter and outer perimeter formed by a curved line with a curvature larger than the curvature of sector region 150b, for example. For simplifying the description, surface 102S of drift layer 102 of semiconductor device 100 cut into a rectangular shape is divided into nine regions. In surrounding region 102E, a part including the sector region of termination region 150 is defined as region 102EC and a part including the straight region of termination region 150 is defined as region 102EL. Thus, termination region 150 is divided into four corner regions 102EC and four regions 102EL other than corner regions 102EC.

Figure 2:
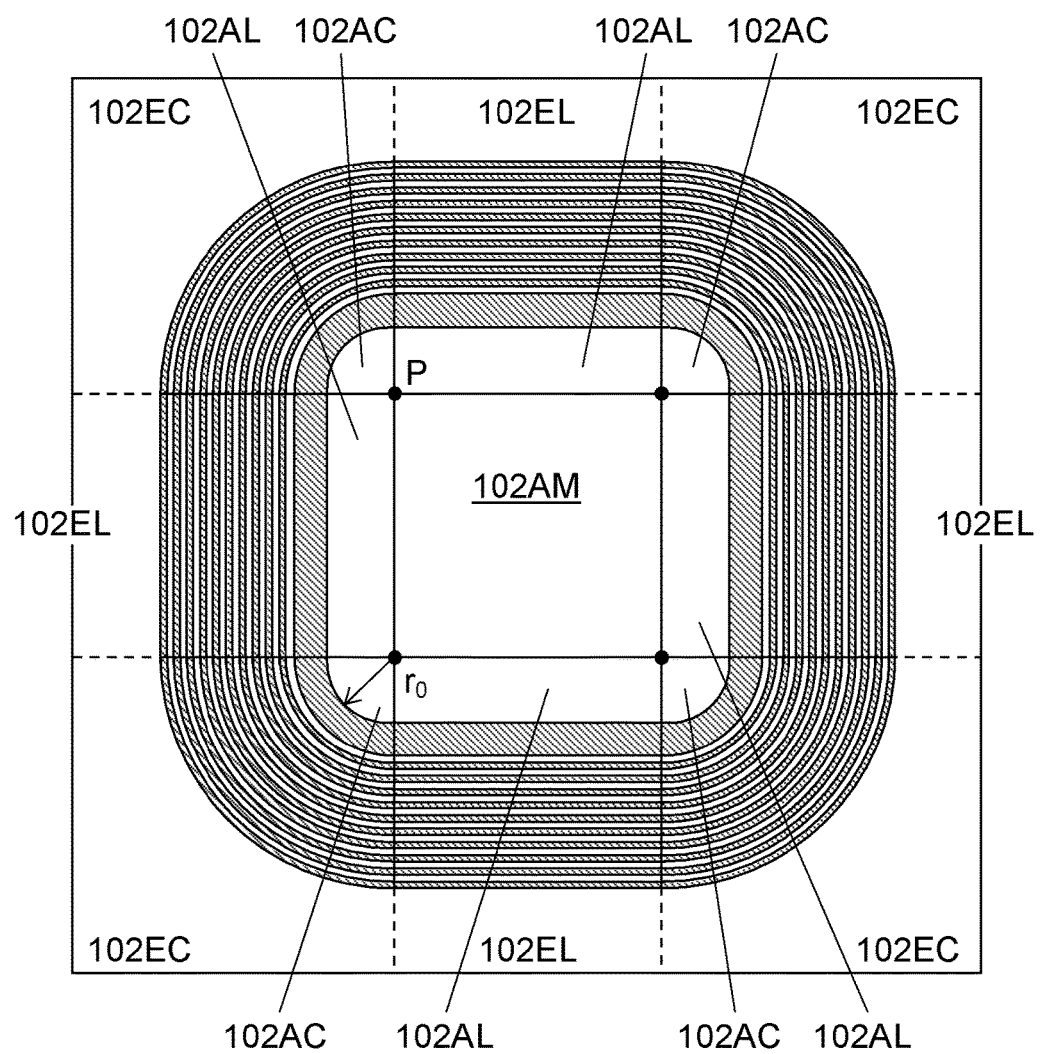
FIG. 2 is a plan view illustrating another example of the termination region formed on the drift layer of the semiconductor device according to the exemplary embodiment of the present disclosure.

The corners of effective region 102A may have a curvature. In this case, as illustrated in FIG. 2, corner regions of effective region 102A including portions in which the boundary between effective region 102A and surrounding region 102E is formed by a curved line are defined as 102AC, regions of effective region 102A including portions in which the boundary between effective region 102A and surrounding region 102E is formed by a straight line is defined as 102AL, and the remaining region of effective region 102A is defined as 102AM. Thus, effective region 102A is divided into four sector regions 102AC, four rectangular regions 102AL, and remaining region 102AM. Returning again to FIG. 1B which shows that the corners of effective region 102A do not have a curvature, effective region 102A and region 102AM coincide with each other. In other words, effective region 102A is not divided.

In the examples illustrated in FIGS. 1B and 2, in termination region 150 located in region 102EC, the inner circumference and outer circumference of the rings in FLR region 152 and the outer circumference of guard ring region 151 have same center of curvature P. In the example in FIG. 2, the inner circumference of guard ring region 151 also has same center of curvature P. While the inner circumference and outer circumference of all rings in FLR region 152 have center of curvature P in the examples in FIGS. 1B and 2, the inner circumference and outer circumference of at least one ring may have center of curvature P.

In the example in FIG. 2, center of curvature P is present within effective region 102A. In other words, center of curvature P is inside the inner circumference of guard ring region 151. When the distance from point P to the inner circumference of guard ring region 151 is defined as radius of curvature $r_0$, $r_0$ assumes a positive value in the example in FIG. 2, while it is zero in the example in FIG. 1B. In the present application, attention is focused on this radius of curvature $r_0$.

In a conventional semiconductor device, radius of curvature $r_0$ is sufficiently large, such as 100 μm or more. The reduction in the breakdown voltage can be suppressed by sufficiently increasing the radius of curvature $r_0$, whereas the area of the effective region 102A is decreased, which reduces an amount of electric current in an on state of the semiconductor device. In other words, on resistance or on voltage is increased. The inventor of the present application has found that, even if radius of curvature $r_0$ is sufficiently decreased, extreme reduction of the breakdown voltage does not occur. With the decrease in radius of curvature $r_0$, the inner circumference of guard ring region 151 becomes angular in regions 102AC illustrated in FIG. 2. Accordingly, the area of effective region 102A is increased, which increases an amount of electric current in the on state of the semiconductor device.

Figure 3:
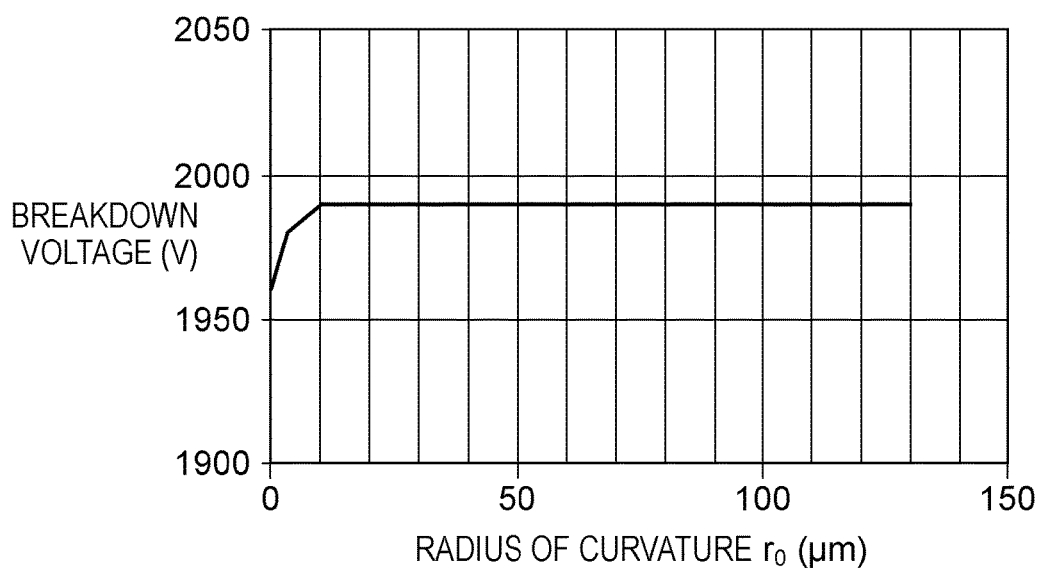
FIG. 3 is a diagram illustrating dependence of a breakdown voltage on a radius of curvature in the semiconductor device according to the exemplary embodiment of the present disclosure.

An avalanche breakdown voltage of semiconductor device 100 was evaluated with radius of curvature $r_0$ being used as a parameter. FIG. 3 illustrates a result obtained by plotting avalanche breakdown voltages when radius of curvature $r_0$ is zero, 3 μm, 10 μm, 50 μm, and 130 μm. The breakdown voltage was standardized by the area of effective region 102A, and a voltage when the electric current value was 0.01 A/cm$^2$ was defined as the breakdown voltage. In a semiconductor device having radius of curvature $r_0$ being 100 μm or more which is typical in a conventional semiconductor device, a breakdown voltage of about 1990 V was obtained, and in a semiconductor device having radius of curvature $r_0$ being from 10 μm to 50 μm inclusive, a breakdown voltage of an almost equal level was also obtained.

This indicates that the radius of curvature of the inner circumference of the guard ring region may be from 10 μm to 50 μm inclusive. With this configuration, a sufficient area of effective region 102A can be ensured while maintaining a high breakdown voltage equal to the breakdown voltage of the conventional semiconductor device having a radius of curvature being 100 μm or more, whereby an effect of enabling use of the semiconductor device in a large electric current environment can be obtained.

Figure 4:
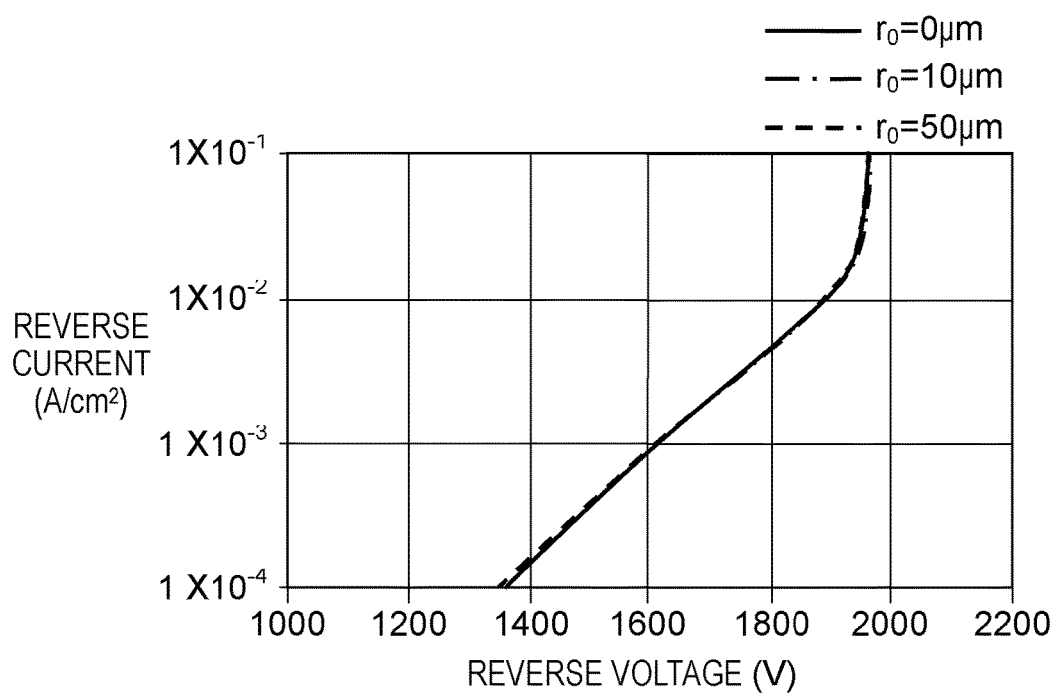
FIG. 4 is a diagram illustrating reverse leakage current-voltage characteristics of the semiconductor device according to the exemplary embodiment of the present disclosure.

On the other hand, a reduction in the breakdown voltage was observed in a semiconductor device with radius of curvature $r_0$ being 10 μm or less as illustrated in FIG. 3. However, it was confirmed that such reduction in the breakdown voltage was an insignificant level for practical applications. To provide the ground thereof, reverse current-voltage characteristics of semiconductor device 100 is illustrated in FIG. 4. Herein, the reverse direction indicates a case where a negative voltage with respect to second electrode 110 is applied to first electrode 159. In FIG. 4, reverse current-voltage characteristics of semiconductor devices 100 with radius of curvature $r_0$ being zero, 10 μm, and 50 μm are illustrated all together. It is understood that a current extremely increases around a point where the voltage exceeds 1950 V, which indicates that an avalanche current flows. The avalanche breakdown voltage at that time is a little smaller in the semiconductor device with a radius of curvature $r_0$ of zero than in the semiconductor device with a radius of curvature $r_0$ of 50 µm. On the other hand, regarding a leakage current zone where the voltage is 1900 V or lower, it is found that the waveforms of the semiconductor devices with radius of curvature $r_0$ being zero, 10 µm, and 50 µm overlap one another almost perfectly. To sum it up, a decrease in radius of curvature $r_0$ has no effect on a leakage current and raises no problem for practical applications, although a slight reduction in the breakdown voltage is observed.

In other words, the radius of curvature of the inner circumference of the guard ring region may be 10 µm or less. With this configuration, a sufficient area of effective region 102A can be ensured, and an effect in which the semiconductor device can be used in a large electric current environment while suppressing an increase in a leakage current can be obtained, although a slight reduction in the breakdown voltage is observed, compared with the conventional semiconductor device with a radius of curvature of 100 µm or more. Further, if the radius of curvature of the inner circumference of guard ring region 151 is zero as illustrated in the example in FIG. 1B, the area of effective region 102A can be maximized while suppressing the reduction in the breakdown voltage, which leads to an effect of enabling use of the semiconductor device in a large electric current environment.

In the example in FIG. 1B, when the radius of curvature of the inner circumference of guard ring region 151 is zero, center of curvature P is on the four corners of effective region 102A, that is, on the corners of the inner circumference of guard ring region 151. The state where the radius of curvature of the inner circumference of guard ring region 151 is zero can be restated as a state where radius of curvature P coincides with the inner circumference of guard ring region 151. In the example in FIG. 1B, the inner circumference of guard ring region 151 has right-angled corners but is not limited thereto.

In the conventional semiconductor device with a radius of curvature of 100 µm or more, the size of the entire semiconductor device needs to be increased to increase the area of the effective region. On the other hand, in the semiconductor device according to the present exemplary embodiment, an effective region having an area equal to the area of the effective region of the conventional semiconductor device can be implemented with a size smaller than the size of the conventional semiconductor device.

In the illustrated example, termination region 150 surrounding almost rectangular effective region 102A has the above-mentioned sector sections outside the four corners of effective region 102A, respectively. It is to be noted that the termination region in the present exemplary embodiment may have the above-mentioned sector section outside at least one of the corners of effective region 102A. Effective region 102A is also not limited to have a rectangular planar shape.

(Method for Producing Semiconductor Device)

Next, how to produce semiconductor device 100 according to this exemplary embodiment will now be described herein with reference to FIGS. 5 to 13. FIGS. 5 to 13 are each a sectional view illustrating a part of the method for producing semiconductor device 100 according to the present exemplary embodiment.

First, semiconductor substrate 101 is prepared. Semiconductor substrate 101 is, for example, a low resistance, n-type 4H—SiC (0001) off-cut substrate cut at an angle of 4 degrees in the direction of <11-20>, for example, and having a resistivity of approximately 0.02 Ωcm.

Figure 5:
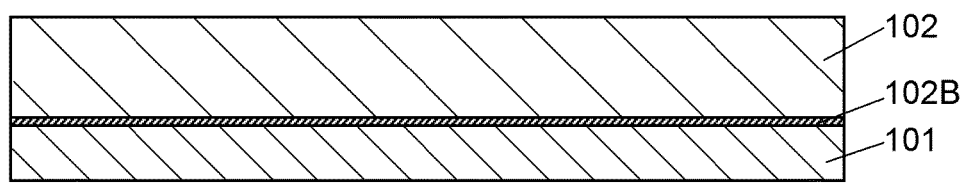
FIG. 5 is a schematic sectional view illustrating a method for forming the semiconductor device according to the exemplary embodiment of the present disclosure.

As illustrated in FIG. 5, high resistance, n-type drift layer 102 is formed on semiconductor substrate 101 through epitaxial growth. Before drift layer 102 is formed, buffer layer 102B made of SiC that is n-type, and that has a higher impurity concentration may be deposited on semiconductor substrate 101. An impurity concentration of the buffer layer is $1 \times 10^{18}$ cm$^{-3}$, for example, and a thickness of the buffer layer is 1 µm, for example. Drift layer 102 is made of n-type 4H—SiC, for example, and an impurity concentration and thickness of drift layer 102 are $6 \times 10^{15}$ cm$^{-3}$ and 11 µm, respectively. The concentration and thickness are determined, as appropriate, for obtaining a required breakdown voltage, and therefore, not limited to the values described above.

Figure 6:
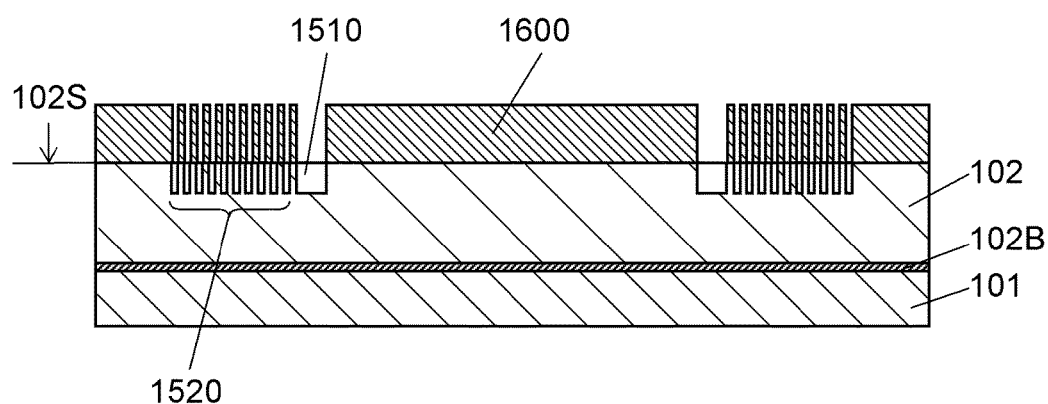
FIG. 6 is a schematic sectional view illustrating the method for forming the semiconductor device according to the exemplary embodiment of the present disclosure.

Next, as illustrated in FIG. 6, mask 1600 made of SiO$_2$, for example, is formed on drift layer 102, and then, Al ions are implanted into drift layer 102, for example. Thus, ion implantation regions 1510 and 1520 are formed in drift layer 102. Ion implantation regions 1510 and 1520 later serve as guard ring region 151 and FLR region 152, respectively. If the shape of mask 1600 in a central region is rectangular or square, the inner circumference of guard ring region 151 has right-angled corners. However, in a practical sense, the corners of mask 1600 in the central region are not perfectly right-angled but may have a radius of curvature of several µm.

Although not illustrated, impurities of a first conductivity type may be implanted to the back surface of semiconductor substrate 101, as necessary, to further increase the concentration of the first conductivity type impurities at the back surface.

Figure 7:
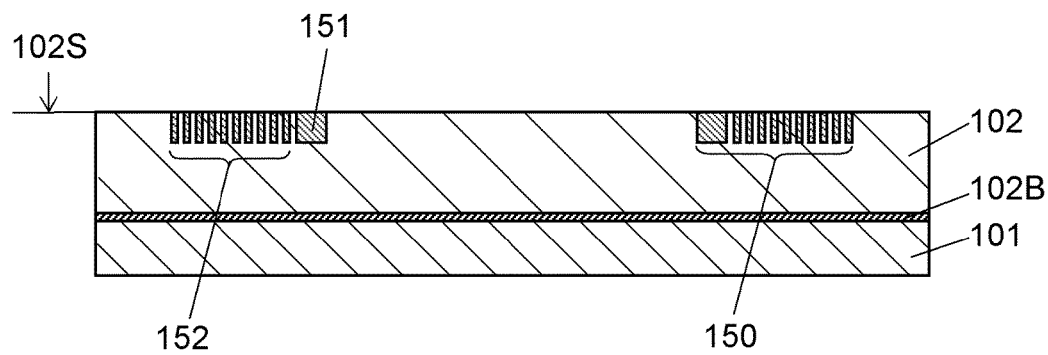
FIG. 7 is a schematic sectional view illustrating the method for forming the semiconductor device according to the exemplary embodiment of the present disclosure.

Next, as illustrated in FIG. 7, after mask 1600 is removed, a heat treatment is performed at a temperature in a range from 1500° C. to 1900° C. inclusive, whereby guard ring region 151 and FLR region 152 are respectively formed from ion implantation regions 1510 and 1520. Before the heat treatment is performed, a carbon film may be deposited on a surface of drift layer 102, and then, after the heat treatment is performed, the carbon film may be removed. After this process, a thermal oxide film may be formed on the surface of drift layer 102, and then, the thermal oxide film may be removed through etching to clean the surface of drift layer 102. Width W of guard ring region 151 illustrated in FIG. 1A is 15 µm, for example. FLR region 152 includes a plurality of rings to surround guard ring region 151. The width of the implantation region of each of the plurality of FLRs is from 1 µm to 2 µm, for example, and the space between FLRs is about 0.7 µm to 5 µm. The width of each FLR and the space between FLRs may be fixed or vary for obtaining a required breakdown voltage of semiconductor device 100. In the present exemplary embodiment, FLR region 152 has ten FLRs. However, the number of FLRs may be changed for obtaining a required breakdown voltage. For example, FLR region 152 may have about twenty-five FLRs. The maximum concentration of the second conductivity type impurities in termination region 150 including guard ring region 151 and FLR region 152 is about $2 \times 10^{20}$ cm$^{-3}$, for example, and the depth is 1 µm, for example. The depth is defined at a location where the concentration of the second conductivity type impurities in the termination region 150 becomes equal to the concentration of first conductivity type impurities in drift layer 102.

Figure 8:
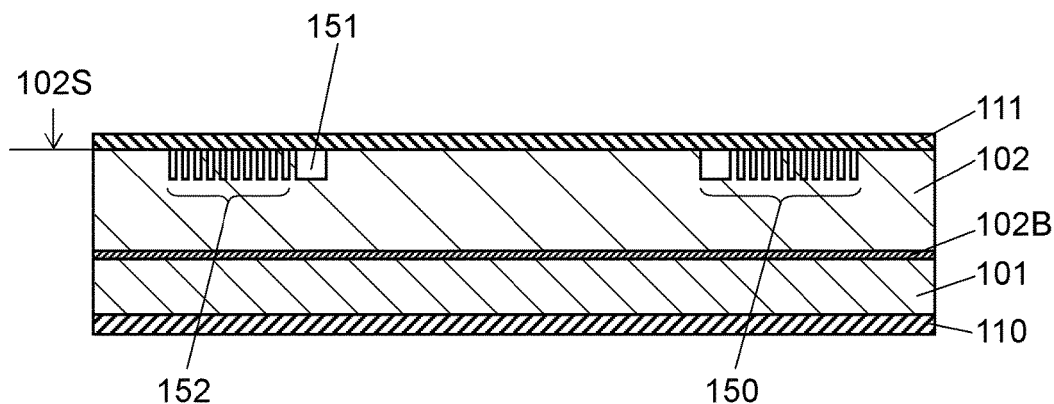
FIG. 8 is a schematic sectional view illustrating the method for forming the semiconductor device according to the exemplary embodiment of the present disclosure.

Next, as illustrated in FIG. 8, insulating film 111 made of SiO$_2$, for example, is formed on the surface of drift layer 102 with a thickness of 500 nm, for example, to protect the surface. Then, Ni, for example, is deposited on the back surface of semiconductor substrate 101 with a thickness of about 200 nm and then heat treated at about 1000° C. to form second electrode 110. Second electrode 110 forms an ohmic contact with the back surface of semiconductor substrate 101. The material of the electrode is not limited to Ni, and any metals that can form a silicide may be used, such as Ti or Mo.

Figure 9:
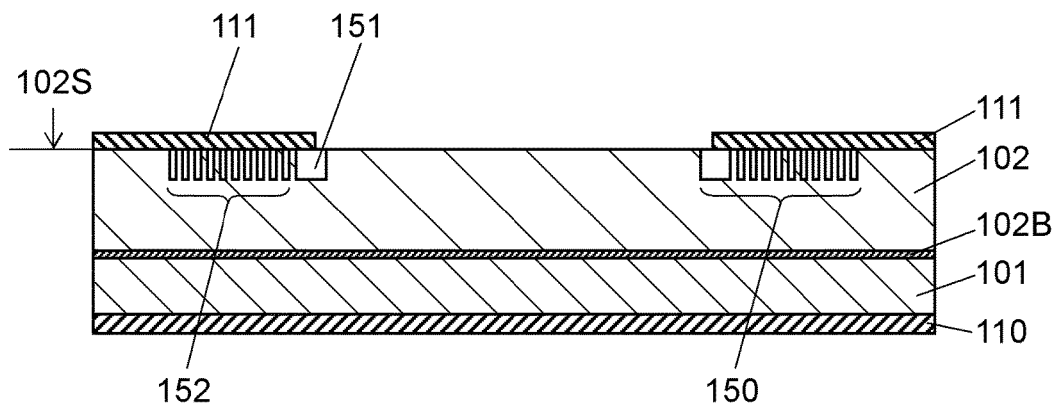
FIG. 9 is a schematic sectional view illustrating the method for forming the semiconductor device according to the exemplary embodiment of the present disclosure.

Next, a mask is formed through photo-resist to allow a part of guard ring region 151 and drift layer 102 inside guard ring region 151 to expose through wet etching, for example. The mask is then removed. In this way, insulating film 111 having an opening can be obtained as illustrated in FIG. 9.

Figure 10:
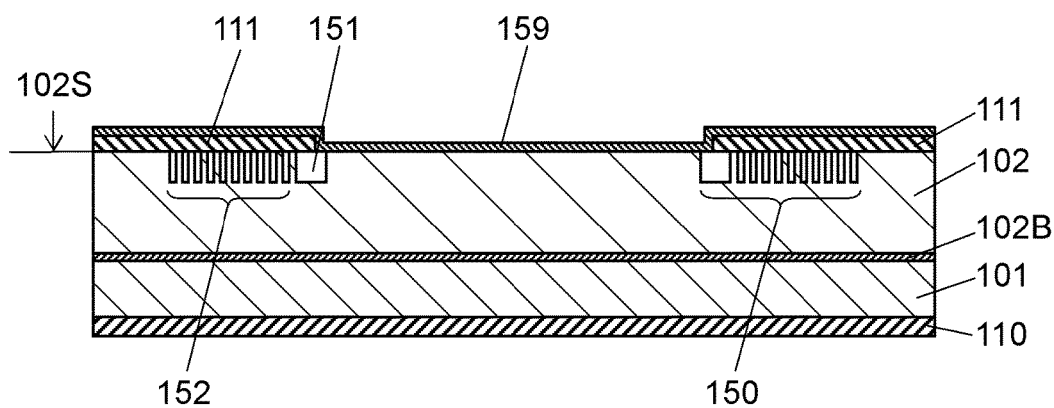
FIG. 10 is a schematic sectional view illustrating the method for forming the semiconductor device according to the exemplary embodiment of the present disclosure.

Next, as illustrated in FIG. 10, a first electrode conductive film (first electrode 159) is deposited so as to wholly cover insulating film 111 having the opening and drift layer 102 exposed in the opening. The first electrode conductive film is made of a material such as Ti, Ni, and Mo. A thickness of the first electrode conductive film is 200 nm, for example. Thereafter, a heat treatment is performed for semiconductor substrate 101 including first electrode conductive film (first electrode 159) at a temperature in a range from 100° C. to 700° C. inclusive. The first electrode conductive film (first electrode 159) thus forms a Schottky contact with drift layer 102.

Figure 11:
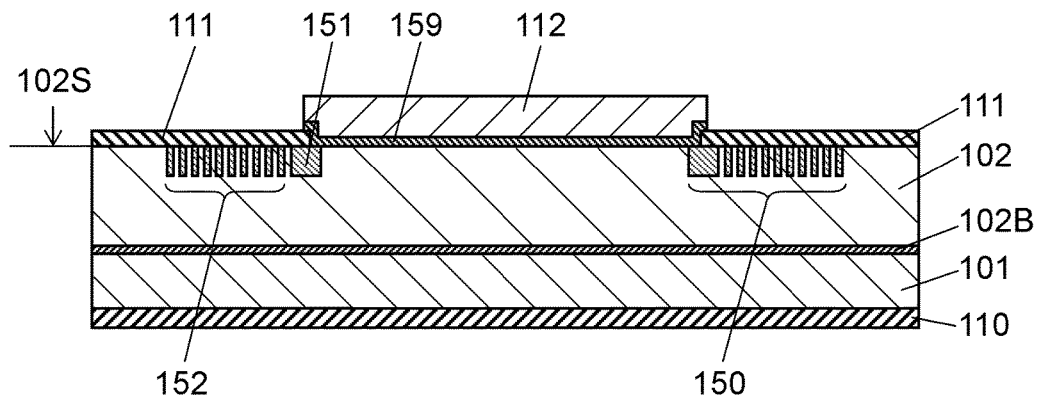
FIG. 11 is a schematic sectional view illustrating the method for forming the semiconductor device according to the exemplary embodiment of the present disclosure.

Next, a front face electrode conductive film is deposited on the first electrode conductive film (first electrode 159). The front face electrode conductive film is a metal film that contains Al, for example, and that has a thickness of approximately 4 μm. A mask is formed on the front face electrode conductive film, and unnecessary portions are etched to remove a part of the first electrode conductive film (first electrode 159) together. Thus, a part of insulating film 111 is exposed. By removing the mask after the part of the front face electrode conductive film is etched, front face electrode 112 and patterned first electrode 159 are formed as illustrated in FIG. 11. The etching during this process may be wet etching or dry etching.

Figure 12:
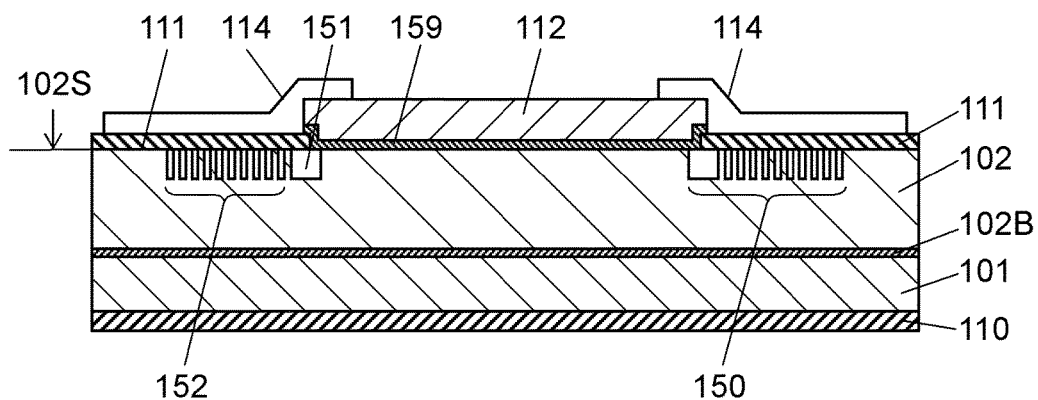
FIG. 12 is a schematic sectional view illustrating the method for forming the semiconductor device according to the exemplary embodiment of the present disclosure.

Next, passivation film 114 is formed, as necessary, as illustrated in FIG. 12. First, an insulating film (passivation film 114) which is an organic film made of SiN or polyimide and which is to be used as a passivation film is formed on insulating film 111 and front face electrode 112, which are exposed. Thereafter, a mask is prepared which has an opening for exposing the insulating film (passivation film 114) formed on front face electrode 112 as a passivation film and an end of semiconductor device 100, and a part of the passivation film is etched by dry etching, wet etching, development, or other processes to expose a part of front face electrode 112 and the end of semiconductor device 100. The mask is then removed. Thus, passivation film 114 having an opening through which a part of front face electrode 112 is exposed is obtained as illustrated in FIG. 12. Passivation film 114 may be an insulating body. For example, passivation film 114 may be an $SiO_2$ film or an organic film made of polybenzoxazole, for example.

Figure 13:
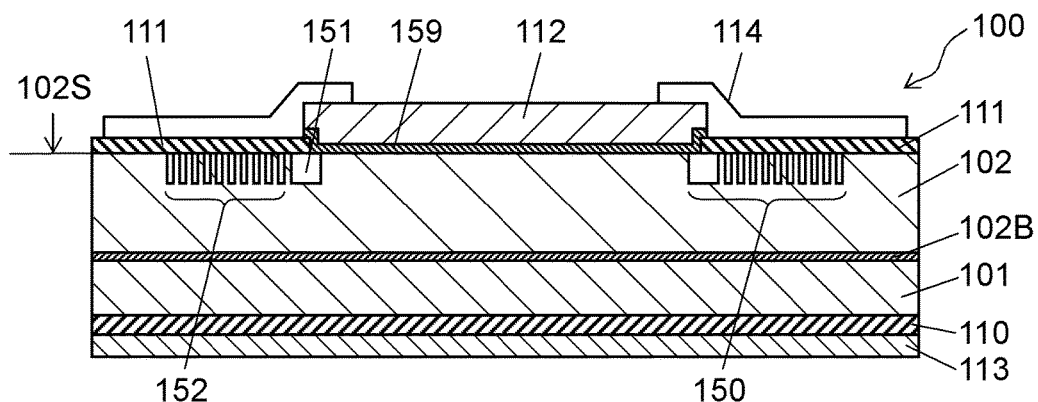
FIG. 13 is a schematic sectional view illustrating the method for forming the semiconductor device according to the exemplary embodiment of the present disclosure.

Next, as illustrated in FIG. 13, back face electrode 113 is formed as required. A process of forming back face electrode 113 may be performed before a process of forming passivation film 114 described above, or before a process of forming front face electrode 112. For back face electrode 113, Ti, Ni, and Ag are deposited in order from a side abutting second electrode 110, for example. Respective thicknesses of Ti, Ni, and Ag are 0.1 μm, 0.3 μm, and 0.7 μm, for example. Semiconductor device 100 is formed through the above-described processes.

(Modifications)

Modifications of the semiconductor device according to the present exemplary embodiment will now be described.

FIGS. 14A to 16B illustrate a semiconductor device having a junction barrier Schottky (JBS) structure by forming barrier region 153 in effective region 102A with respect to termination region 150 which is the gist of the present disclosure. A plurality of barrier regions 153 of a second conductivity type may be formed in a region, which is inside termination region 150, in drift layer 102 as viewed in the normal direction of semiconductor substrate 101. The formation of barrier regions 153 can reduce a Schottky leakage current when a reverse bias with respect to the Schottky contact formed between first electrode 159 and drift layer 102 is applied. Barrier regions 153 may be formed simultaneously with termination region 150.

Figure 14A:
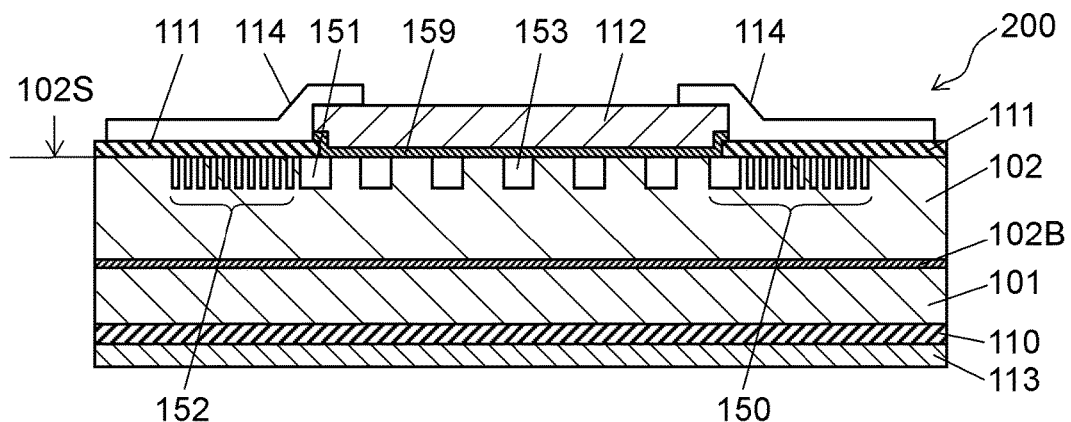
FIG. 14A is a view illustrating a cross section of a semiconductor device according to an exemplary embodiment of the present disclosure.
Figure 14B:
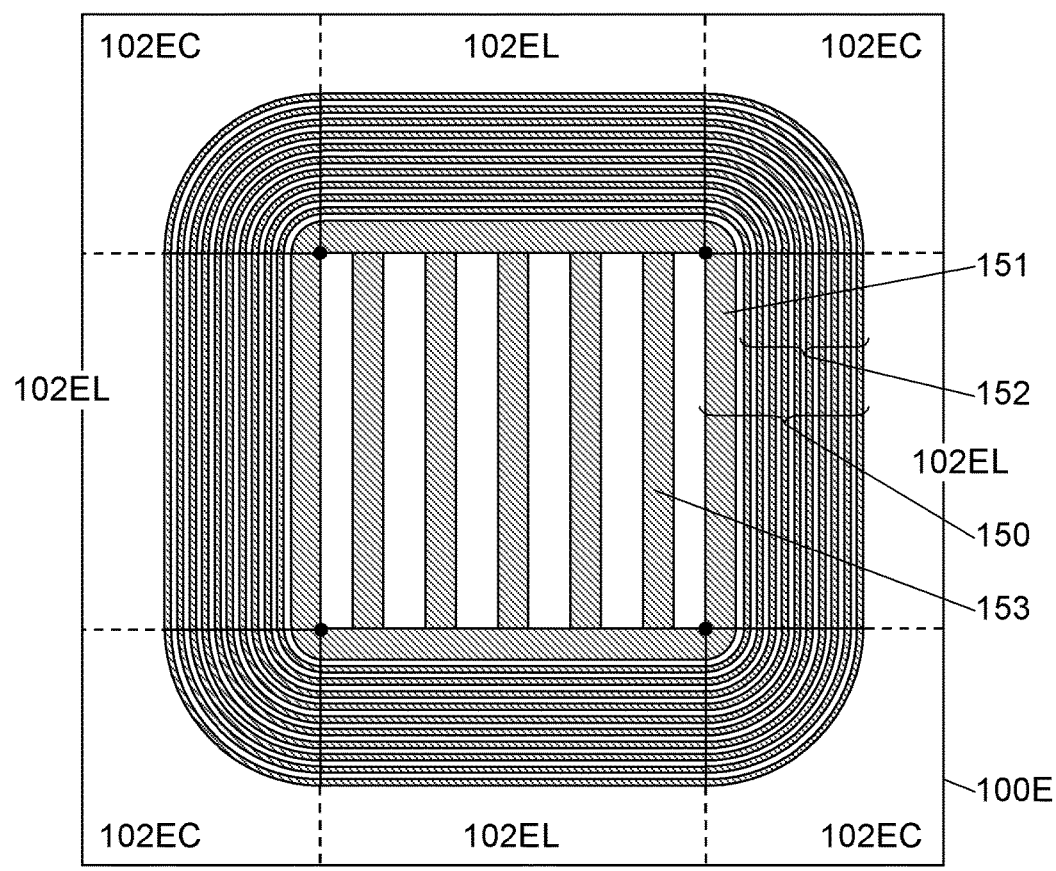
FIG. 14B is a plan view illustrating a termination region and a barrier region formed on a drift layer of the semiconductor device according to the exemplary embodiment of the present disclosure.

Semiconductor device 200 illustrated in FIGS. 14A and 14B has a plurality of barrier regions 153 equally spaced from each other and extending in one direction. The width of each barrier region 153 is from 1 μm to 2 μm, for example, and the space between adjacent barrier regions 153 is from 2 μm to 10 μm, for example. The width of barrier region 153 may be smaller than the space between adjacent barrier regions 153.

Figure 15A:
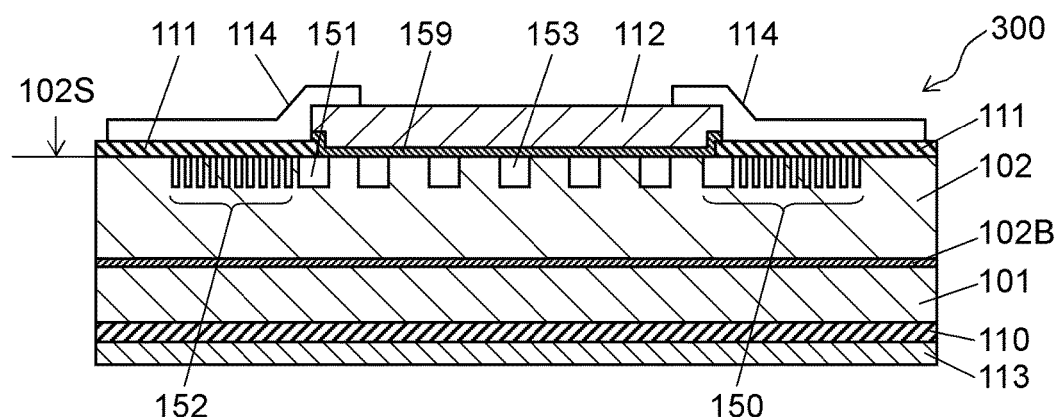
FIG. 15A is a view illustrating a cross section of a semiconductor device according to an exemplary embodiment of the present disclosure.
Figure 15B:
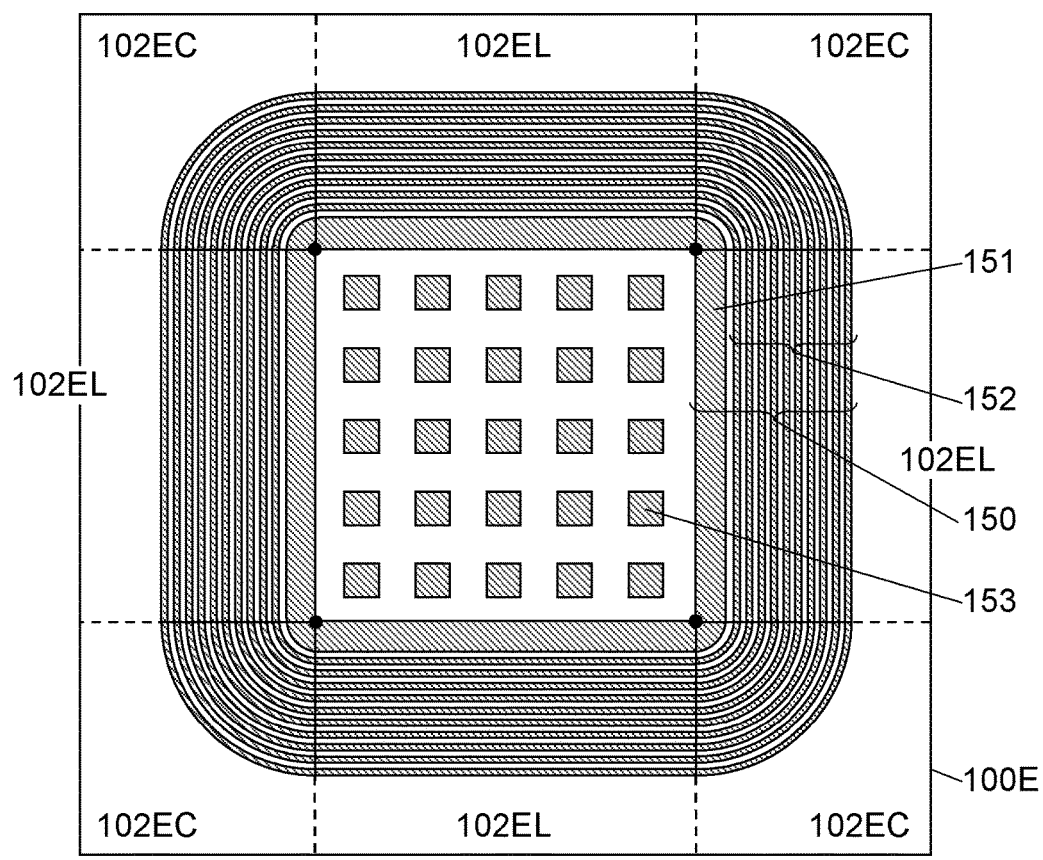
FIG. 15B is a plan view illustrating a termination region and a barrier region formed on a drift layer of the semiconductor device according to the exemplary embodiment of the present disclosure.

Semiconductor device 300 illustrated in FIGS. 15A and 15B has a plurality of rectangular barrier regions 153 equally spaced from each other. The length of one side of each barrier region 153 is from 1 μm to 2 μm, for example, and the space between adjacent barrier regions 153 is from 2 μm to 10 nm, for example. The width of barrier region 153 may be smaller than the space between adjacent barrier regions 153. Barrier region 153 in FIGS. 15A and 15B has a square shape but may have other polygonal shapes including a rectangular shape or a circular shape.

Figure 16A:
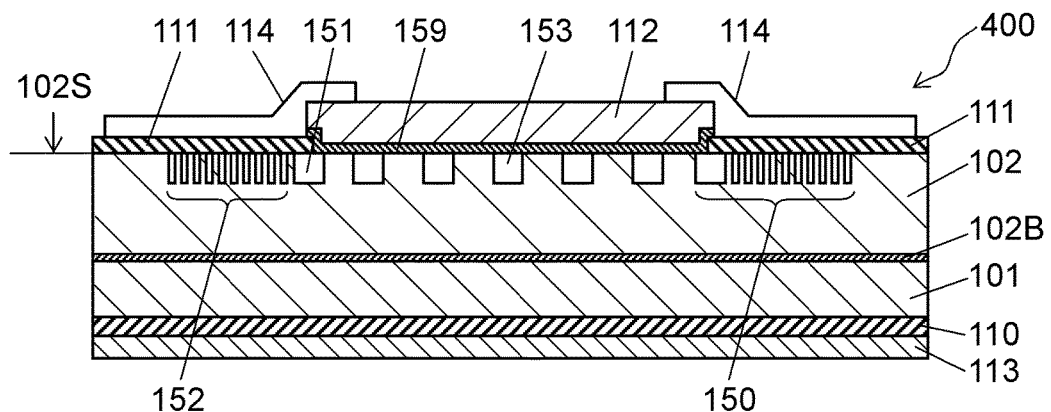
FIG. 16A is a view illustrating a cross section of a semiconductor device according to an exemplary embodiment of the present disclosure.
Figure 16B:
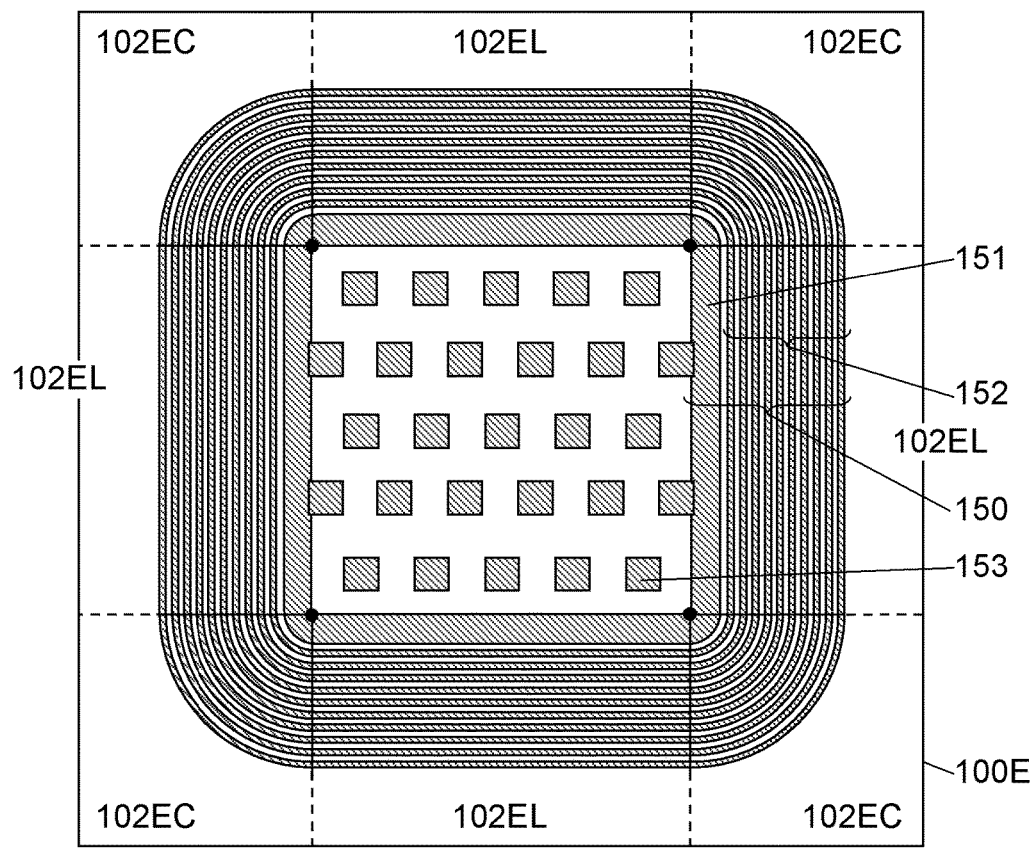
FIG. 16B is a plan view illustrating a termination region and a barrier region formed on a drift layer of the semiconductor device according to the exemplary embodiment of the present disclosure.

Semiconductor device 400 illustrated in FIGS. 16A and 16B has barrier regions 153 illustrated in FIG. 15B, barrier regions 153 being displaced relative to one another by ½ pitch by slightly changing the positions of barrier regions 153. As illustrated in FIG. 16B, a part of the inner circumference of guard ring region 151 in region 102EL may overlap barrier regions 153. Although not illustrated, barrier regions 153 may overlap the inner circumference of guard ring region 151 in region 102EC. In a configuration in which the inner circumference of guard ring region 151 partially overlap barrier region 153, the inner circumference of guard ring region 151 overlapping barrier region 153 can be specified by the outer circumference of guard ring region 151 and width W of guard ring region 151. The same is applied to a configuration in which the inner circumference of guard ring region 151 abuts barrier regions 153.

The shape and arrangement of barrier regions 153 described above are not limited to those described above.

Other modifications of the semiconductor device according to the exemplary embodiment will further be described below.

Figure 17A:
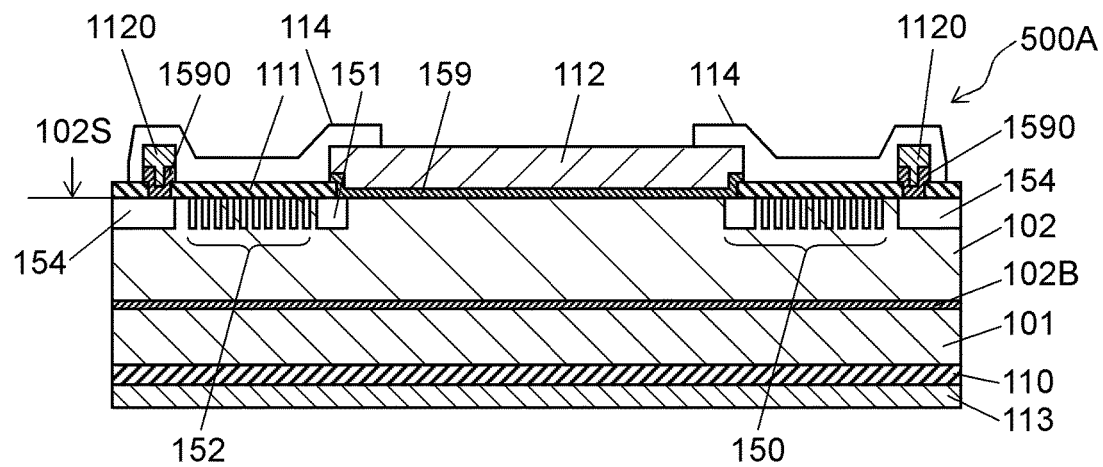
FIG. 17A is a view illustrating a cross section of a modification of the semiconductor device according to the exemplary embodiment of the present disclosure.
Figure 17B:
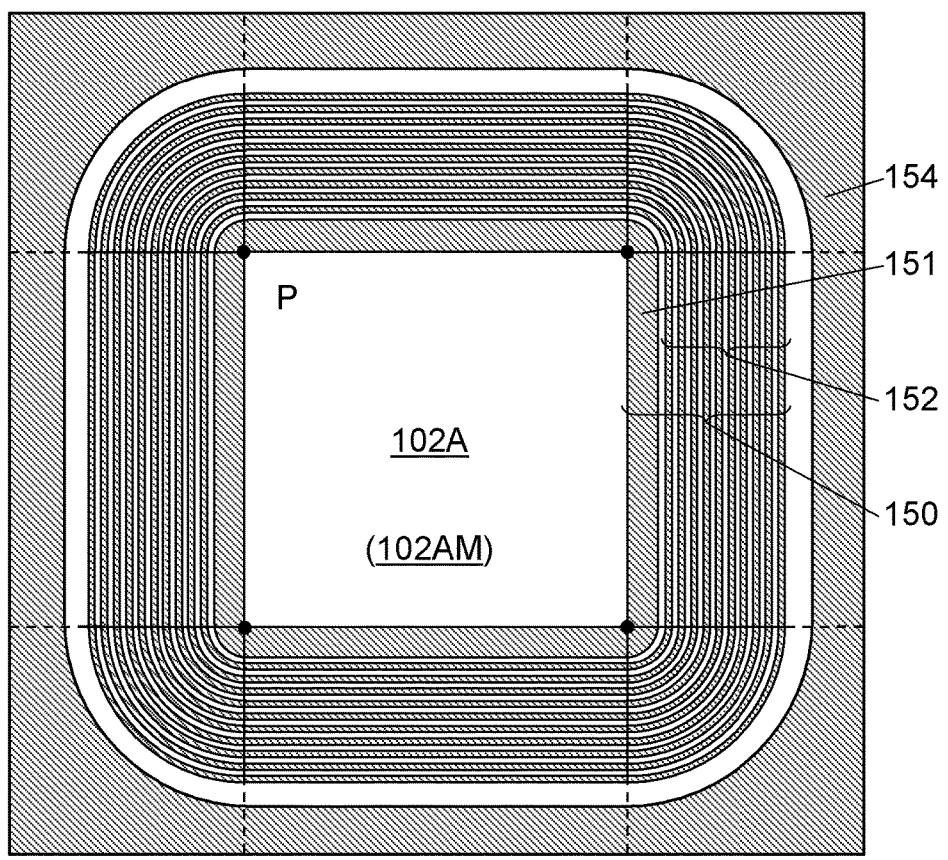
FIG. 17B is a plan view illustrating a termination region and a termination implantation region formed on a drift layer of the modification of the semiconductor device according to the exemplary embodiment of the present disclosure.
Figure 17C:
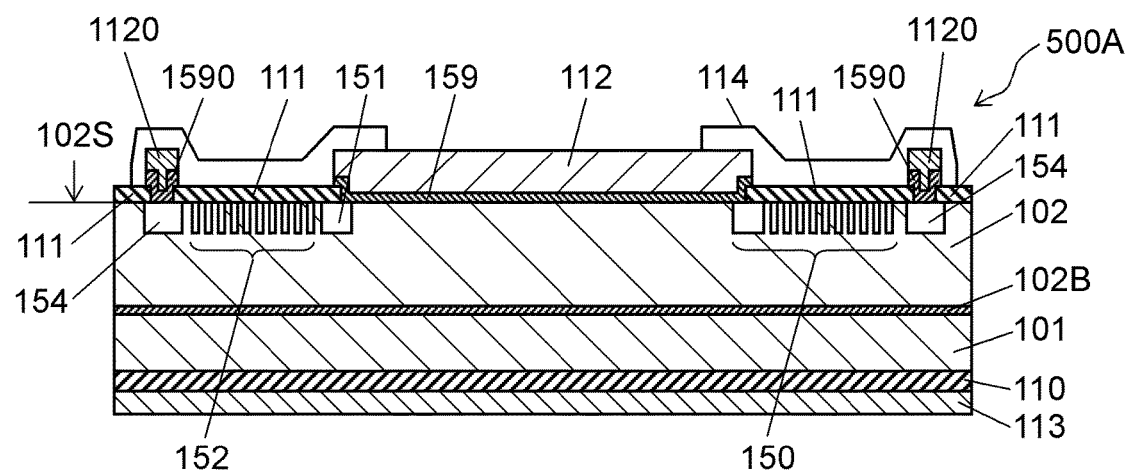
FIG. 17C is a view illustrating a cross section of a modification of the semiconductor device according to the exemplary embodiment of the present disclosure.
Figure 17D:
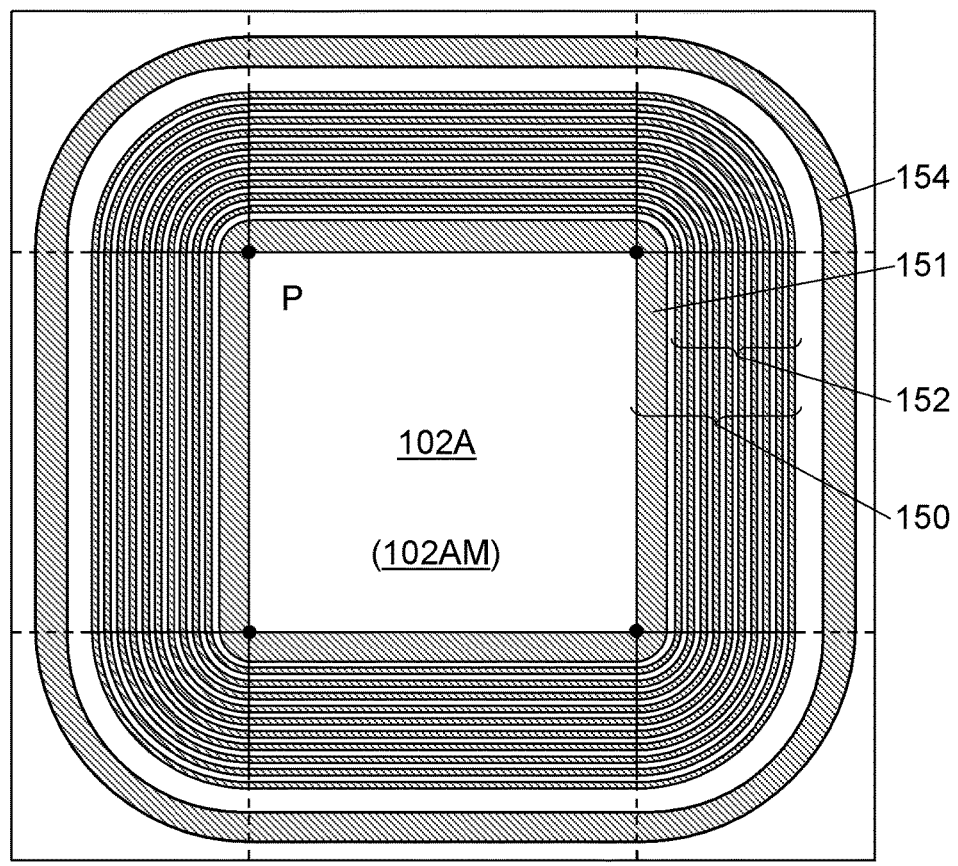
FIG. 17D is a plan view illustrating a termination region and a termination implantation region formed on a drift layer of the modification of the semiconductor device according to the exemplary embodiment of the present disclosure.

FIGS. 17A and 17B illustrate semiconductor device 500A formed by adding seal ring 1120 to semiconductor device 100 illustrated in FIG. 1A in a region outside termination region 150 and inside the end of semiconductor device 100. Barrier metal 1590 may be provided below seal ring 1120. When seal ring 1120 is provided, a part of drift layer 102 is exposed to be in contact with barrier metal 1590 by forming an opening in a part of insulating film 111. In addition, termination implantation region 154 of a second conductivity type may be provided in the region abutting barrier metal 1590. In this case, barrier metal 1590 may be directly in contact with termination implantation region 154. In semiconductor device 500A illustrated in FIGS. 17A and 17B, termination implantation region 154 is disposed to be in contact with the end of the semiconductor device while being separated from the outer circumference of FLR region 152. However, termination implantation region 154 may have a ring shape with a constant width as illustrated in FIGS. 17C and 17D. The current-voltage characteristics of semiconductor device 500A are almost the same, whether termination implantation region 154 is disposed to be in contact with the end of the semiconductor device or not to be in contact therewith. In addition, the center of curvature of the inner circumference of termination implantation region 154 at the corners of the semiconductor device may coincide with point P.

Figure 18:
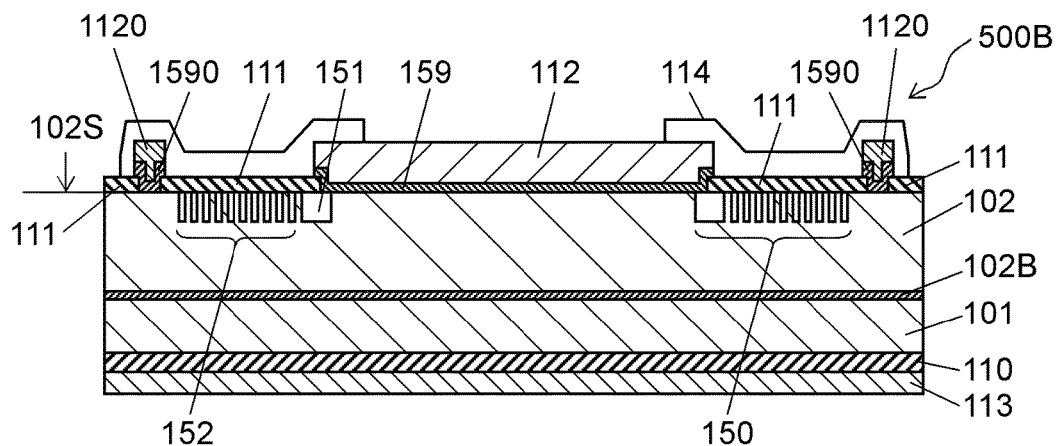
FIG. 18 is a view illustrating a cross section of a modification of the semiconductor device according to the exemplary embodiment of the present disclosure.

Semiconductor device 500B illustrated in FIG. 18 has a structure formed by eliminating termination implantation region 154 from semiconductor device 500A. In this case, barrier metal 1590 may be directly in contact with drift layer 102. Even if termination implantation region 154 is not provided, the current-voltage characteristics of semiconductor device 500B is almost the same as the current-voltage characteristics of semiconductor device 500A illustrated in FIGS. 17A to 17D.

Figure 19:
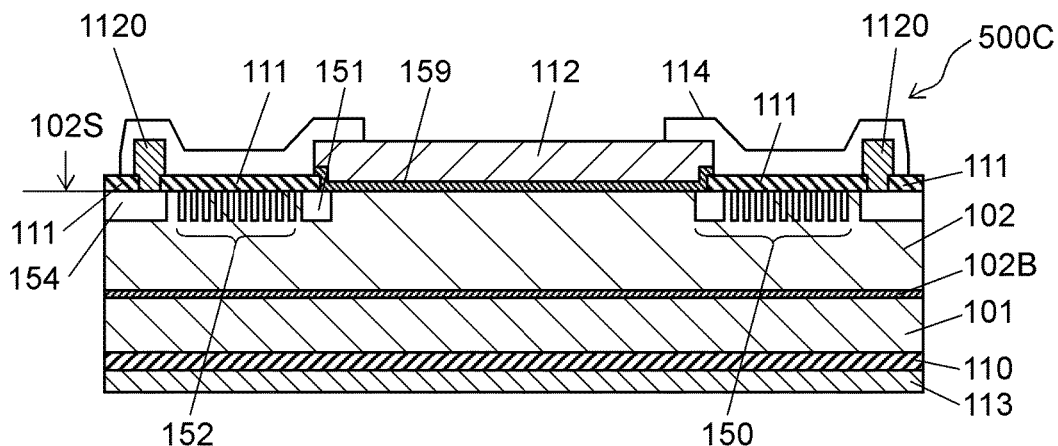
FIG. 19 is a view illustrating a cross section of a modification of the semiconductor device according to the exemplary embodiment of the present disclosure.

Semiconductor device 500C illustrated in FIG. 19 has a structure formed by eliminating barrier metal 1590 from semiconductor device 500A. In this case, seal ring 1120 may be directly in contact with termination implantation region 154.

Figure 20:
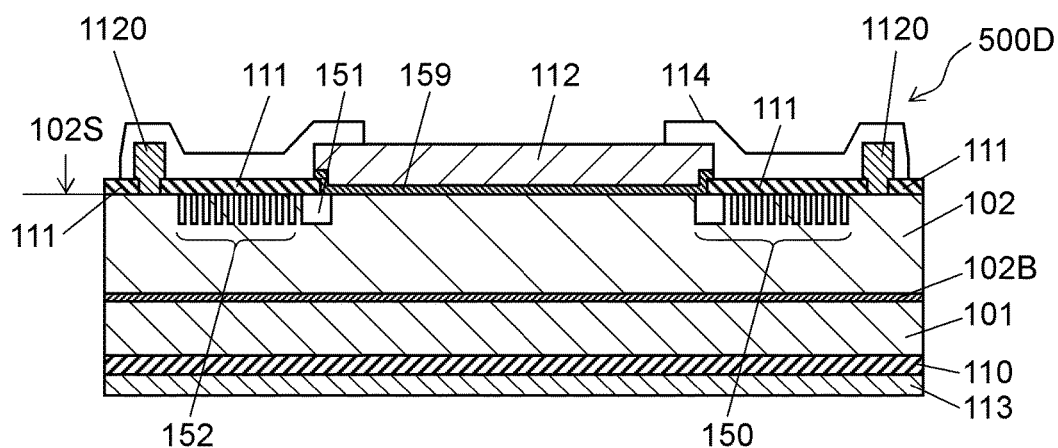
FIG. 20 is a view illustrating a cross section of a modification of the semiconductor device according to the exemplary embodiment of the present disclosure.

Semiconductor device 500D illustrated in FIG. 20 has a structure formed by eliminating barrier metal 1590 and termination implantation region 154 from semiconductor device 500A. In this case, seal ring 1120 may be directly in contact with drift layer 102.

Barrier metal 1590 may be formed simultaneously with first electrode 159. In addition, seal ring 1120 may be formed simultaneously with front face electrode 112. Further, termination implantation region 154 may be formed simultaneously with termination region 150. In FIGS. 17A, 17B, and 19, termination implantation region 154 is disposed to be in contact with the end of semiconductor device. However, termination implantation region 154 may be disposed to be separated from the end of the semiconductor device as illustrated in FIGS. 17C and 17D. In addition, termination implantation region 154 may be separately formed from a material of a first conductivity type.

Seal ring 1120 illustrated in FIGS. 17A to 20 may be covered by passivation film 114.

Figure 21:
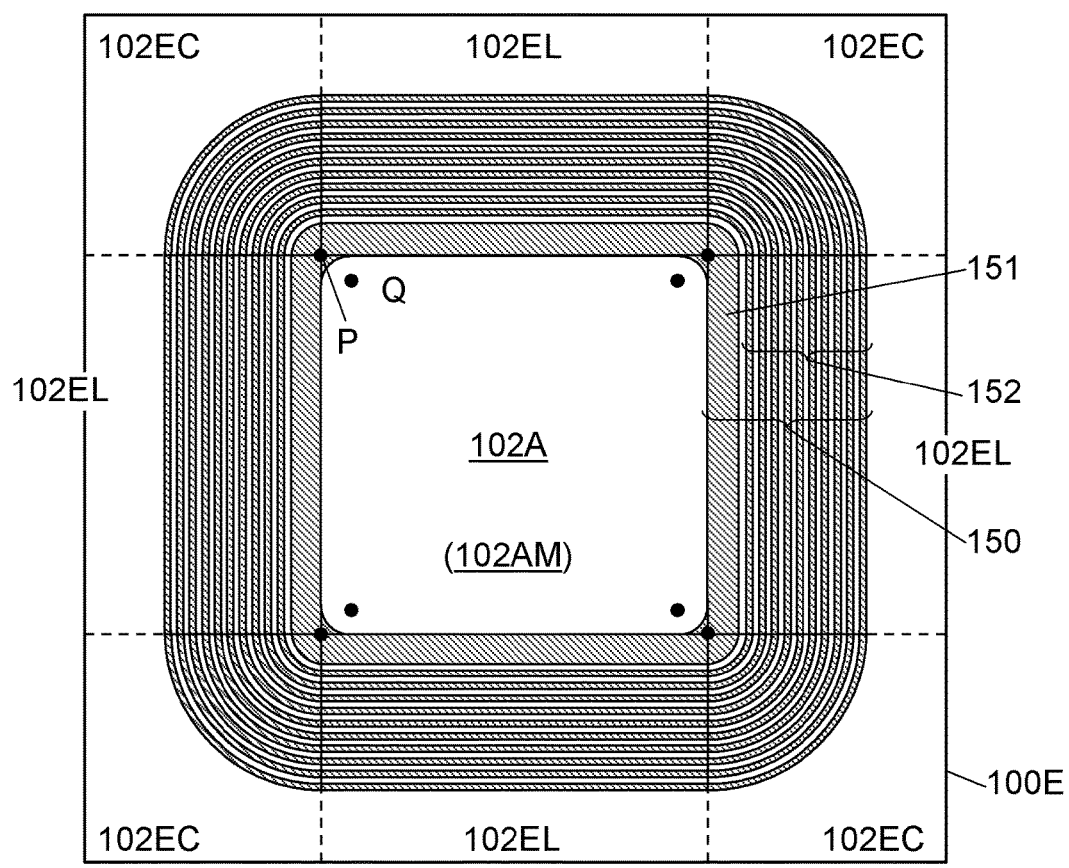
FIG. 21 is a plan view illustrating a modification of the termination region formed on the drift layer of the semiconductor device according to the exemplary embodiment of the present disclosure.

In addition, as compared to semiconductor device 100 illustrated in FIG. 1B in which the inner circumference of guard ring region 151 is defined with the radius of curvature at point P being zero, the area of the inner circumference portion of the guard ring region at the corners may be increased by setting point Q inside point P as another center of curvature as illustrated in FIG. 21. Point P is positioned in guard ring region 151, and point Q is positioned inside the inner circumference of guard ring region 151. Based on width W (μm) of guard ring region 151, the outer circumference of guard ring region 151 may be 50+W (μm). This condition for the outer circumference is the same as the condition of the examples illustrated in FIGS. 1B and 2. However, in this case, effective region 102A is narrowed. When the radius of curvature with point Q being the center of curvature is defined as $r_i$, the distance between points P and Q is represented as follows, compared to the example in FIG. 1B where effective region 102A is rectangle and the center of curvature P coincides with the corners of effective region 102A.

$$PQ=\sqrt{2}\times r_i \quad \text{[Equation 1]}$$

As in the examples illustrated in FIGS. 1B and 2, $r_i$ may be 10 μm or less. The semiconductor device illustrated in FIG. 21 provides effects similar to the effects provided by the semiconductor devices in FIGS. 1B and 2.

The configurations of the semiconductor devices according to the present disclosure and materials of the components are not limited to the configurations and the materials of the above-described examples. For example, the material of first electrode 159 is not limited to Ti, Ni, and Mo described above. A material selected from a group consisting of other metals forming a Schottky contact with drift layer 102 and alloys and compounds thereof may be used for first electrode 159.

In addition, a barrier film containing TiN, for example, may be formed on first electrode 159 and under front face electrode 112. A thickness of the barrier film is 50 nm, for example.

The above exemplary embodiments in the present disclosure have described a case where silicon carbide is 4H—SiC. However, silicon carbide may be another polytype, such as 6H—SiC, 3C—SiC, and 15R—SiC. The exemplary embodiments of the present disclosure have described a case where the main surface of the SiC substrate is the face that is off-cut from a (0001) surface (Si face). However, the main surface of the SiC substrate may be a (11-20) surface, a (1-100) surface, a (000-1) surface (C face), or an off-cut surface of one of them. An Si substrate may be used as semiconductor substrate 101. A 3C—SiC drift layer may be formed on the Si substrate. In this case, annealing for activating impurity ions implanted into 3C—SiC may be performed at a temperature equal to or lower than a melting point of the Si substrate.

The present disclosure can be used for power semiconductor devices to be mounted on consumer power converters, on-board power converters, and power converters for industry machines, for example.

What is claimed is:

1. A semiconductor device comprising:
    a semiconductor substrate of a first conductivity type having a main surface and a back surface;
    a silicon carbide semiconductor layer of a first conductivity type disposed on the main surface of the semiconductor substrate;
    a termination region of a second conductivity type disposed in the silicon carbide semiconductor layer;
    a first electrode which is disposed on the silicon carbide semiconductor layer and forms a Schottky contact with the silicon carbide semiconductor layer; and
    a second electrode which is disposed on the back surface of the semiconductor substrate and forms an ohmic contact with the semiconductor substrate, wherein
    the termination region is disposed to surround a part of a surface of the silicon carbide semiconductor layer as viewed in a normal direction of the main surface of the semiconductor substrate,
    the termination region includes a guard ring region of a second conductivity type abutting the surface of the silicon carbide semiconductor layer and a field limiting ring (FLR) region disposed to surround the guard ring region while being separated from the guard ring region, the FLR region including a plurality of rings of a second conductivity type,
    the first electrode has a face abutting the silicon carbide semiconductor layer, the first electrode abuts the guard ring region at an edge of the face abutting the silicon carbide semiconductor layer, the termination region includes a sector section as viewed in a normal direction of the surface of the silicon carbide semiconductor layer, and in the sector section, an inner circumference and an outer circumference of at least one of the plurality of rings and an inner circumference and an outer circumference of the guard ring region have a same first center of curvature, the first center of curvature being positioned inside the inner circumference of the guard ring region, and a radius of curvature of the inner circumference of the guard ring region is 50 μm or less.

2. The semiconductor device according to claim 1, wherein the radius of curvature of the inner circumference of the guard ring region is 10 μm or more.

3. The semiconductor device according to claim 1, wherein the radius of curvature of the inner circumference of the guard ring region is 10 μm or less.

4. The semiconductor device according to claim 1, wherein the inner circumference of the guard ring region has a right-angled corner.

5. The semiconductor device according to claim 1, wherein
the termination region further includes at least two straight parts whose inner perimeter and outer perimeter are formed by a straight line, and
the sector section is disposed to connect ends of the at least two straight parts.

6. A semiconductor device comprising:
a semiconductor substrate of a first conductivity type having a main surface and a back surface;
a silicon carbide semiconductor layer of a first conductivity type disposed on the main surface of the semiconductor substrate;
a termination region of a second conductivity type disposed in the silicon carbide semiconductor layer;
a first electrode which is disposed on the silicon carbide semiconductor layer and forms a Schottky contact with the silicon carbide semiconductor layer; and
a second electrode which is disposed on the back surface of the semiconductor substrate and forms an ohmic contact with the semiconductor substrate, wherein
the termination region is disposed to surround a part of a surface of the silicon carbide semiconductor layer as viewed in a normal direction of the main surface of the semiconductor substrate,
the termination region includes a guard ring region of a second conductivity type abutting the surface of the silicon carbide semiconductor layer and a field limiting ring (FLR) region disposed to surround the guard ring region while being separated from the guard ring region, the FLR region including a plurality of rings of a second conductivity type,
the first electrode has a face abutting the silicon carbide semiconductor layer,
the first electrode abuts the guard ring region at an edge of the face abutting the silicon carbide semiconductor layer,
the termination region includes a sector section as viewed in a normal direction of the surface of the silicon carbide semiconductor layer, and
in the sector section, an inner circumference and an outer circumference of at least one of the plurality of rings and an outer circumference of the guard ring region have a same first center of curvature, the first center of curvature being positioned on the inner circumference of the guard ring region or within the guard ring region.

7. The semiconductor device according to claim 6, wherein, when a width of the guard ring region is defined as W μm, a radius of curvature of the outer circumference of the guard ring region is 50+W μm or less.

8. The semiconductor device according to claim 6, wherein the inner circumference of the guard ring region has a second center of curvature different from the first center of curvature, the second center of curvature is positioned inside the inner circumference of the guard ring region as viewed in a normal direction of the surface of the silicon carbide semiconductor layer, and a radius of curvature of the inner circumference of the guard ring region is 10 μm or less.

9. The semiconductor device according to claim 6, wherein
the termination region further includes at least two straight parts whose inner perimeter and outer perimeter are formed by a straight line, and
the sector section is disposed to connect ends of the at least two straight parts.

* * * * *